(12) United States Patent
Dickerman et al.

(10) Patent No.: US 10,601,630 B1
(45) Date of Patent: Mar. 24, 2020

(54) QUADRATURE SIGNAL IMBALANCE ESTIMATION

(71) Applicants: Robert Dickerman, Northfield, MA (US); Christopher Dickerman, Northfield, MA (US)

(72) Inventors: Robert Dickerman, Northfield, MA (US); Christopher Dickerman, Northfield, MA (US)

(*) Notice: Subject to any disclaimer, the term of this patent is extended or adjusted under 35 U.S.C. 154(b) by 0 days.

(21) Appl. No.: 16/435,633

(22) Filed: Jun. 10, 2019

(51) Int. Cl.
  *H03D 3/00* (2006.01)
  *H04L 27/38* (2006.01)
  *H04L 27/00* (2006.01)

(52) U.S. Cl.
  CPC ...... *H04L 27/3809* (2013.01); *H04L 27/0014* (2013.01); *H04L 27/3881* (2013.01); *H03D 3/009* (2013.01); *H04L 2027/0016* (2013.01); *H04L 2027/0038* (2013.01)

(58) Field of Classification Search
  USPC ................................ 375/260, 224, 327, 316
  See application file for complete search history.

(56) References Cited

U.S. PATENT DOCUMENTS

| 8,583,064 B2 | 11/2013 | Kang et al. | |
| 8,811,538 B1 | 8/2014 | Manku | |
| 9,042,483 B2* | 5/2015 | Joung | H04B 1/0475 375/296 |
| 9,306,782 B2 | 4/2016 | An et al. | |
| 2006/0291549 A1* | 12/2006 | Seppinen | H04B 17/21 375/227 |
| 2011/0243263 A1* | 10/2011 | Andgart | H04L 5/0048 375/260 |
| 2016/0006632 A1* | 1/2016 | Chen | H04L 27/364 375/224 |

OTHER PUBLICATIONS

Yu, et al., A Novel Adaptive Mismatch Cancellation System for Quadrature IF Radio Receivers, IEEE Trans. Circuits and Systems II, Analog and Digital Signal Processing, vol. 46, Issue 6, Jun. 1999, IEEE, 445 Hoes Lane, Piscataway, NJ 08854-4141.

(Continued)

*Primary Examiner* — Eva Y Puente

(57) ABSTRACT

Devices and methods for estimation of quadrature signal imbalance are provided. A quadrature signal is coupled to a computing system. The computing system determines several points on a symmetry function of corrected quadrature signals, and identifies a symmetry point that may satisfy a threshold level. An imbalance corresponding to the identified symmetry point may be used as an imbalance estimate. The imbalance estimate can be used for imbalance correction. Multiple imbalance estimates can be combined to reduce random errors caused by noise. Triangulation can be used to identify a value of symmetry that satisfies a threshold level. Triangulation allows the determination of the location of a symmetry trough by calculating as few as four symmetry points, thereby permitting embodiments to track rapidly changing imbalance. The disclosed embodiments may be employed in optical velocimetry systems, detection and ranging systems such as radar, sonar, and lidar, ultrasonics, and communications systems.

20 Claims, 8 Drawing Sheets

(56) References Cited

OTHER PUBLICATIONS

Abrar, et al., Blind Adaptive Compensation of I/Q Mismatch and Frequency Offset in Low-IF Receivers, 2014 12th International Conference on Frontiers of Information Technology (FIT), Dec. 17, 2014, IEEE, 445 Hoes Lane, Piscataway, NJ 08854-4141.

Churchill, et al., The Correction of I and Q Errors in a Coherent Processor, IEEE Transactions on Aerospace and Electronics Systems, vol. AES-17, No. 1, Jan. 1981, IEEE, 445 Hoes Lane, Piscataway, NJ 08854-4141.

Sohn, et al., Data-Aided Approach to I/Q Mismatch and DC Offset Compensation in Communication Receivers, IEEE Communications Letters, vol. 6, Issue 12, Dec. 2002, IEEE, 445 Hoes Lane, Piscataway, NJ 08854-4141.

Aziz, et al., Blind Compensation of I/Q Impairments in Wireless Transceivers, MDPI Sensors, Dec. 17, 2017, MDPI, St. Alban-Anlage 66, 4052 Basel, Switzerland.

O'Haver, Peak Finding and Measurement, [online], Aug. 30, 2018, [retrieved on Sep. 9, 2019], Retrieved from the Internet <URL: <http://terpconnect.umd.edu/~toh/spectrum/PeakFindingandMeasurement.htm>.

\* cited by examiner

QUADRATURE SIGNAL IMBALANCE ESTIMATION

TECHNICAL FIELD

The present disclosure relates to devices and methods for the estimation of imbalance in quadrature signals in electronic and optical systems.

BACKGROUND

A quadrature signal is a complex signal with two components, one of which may be interpreted as a real component, and the other of which may be interpreted as an imaginary component. By convention, the two components are named I, for in phase signal, and Q, for quadrature phase signal, respectively. These components may be generated from a single real signal by phase-shifted mixing or sampling. Quadrature signal processing and sampling are widely employed in many fields, including precision metrology and optical velocimetry, detection and ranging systems such as radar, sonar, and lidar, and communications technology. The use of quadrature signal processing may produce many system advantages, including reduced cost and size, and increased flexibility of function. In radar and sonar systems, for example, the use of quadrature signals allows determination of polarity of Doppler shift and, consequently, the direction of motion of the target—that is, away from, or towards, the observer. In communications systems, for example, multiple modulation modes may be implemented in the same hardware by varying the manner of baseband signal processing, when quadrature sampling is used.

In practice, however, quadrature signals invariably have at least some amplitude error and phase error, that can act to reduce system performance. In radio systems, for example, the I and Q quadrature signals may be generated by a pair of mixers whose local oscillators are phase-shifted by 90.0°. Alternatively, if sampling is used, samplers whose sample clocks are phase-shifted by 90.0°, together with lowpass filtering for analog systems or decimation for digital systems, may be employed to generate the I and Q signals. If the processing gains in the I and Q signal paths of such quadrature signal generators are not identical, the resulting I and Q signals are said to have amplitude imbalance. If the sampling phase for the I and Q signals is not exactly 90.0°, they are said to have phase imbalance. These errors are collectively termed quadrature signal imbalance. At a system level, quadrature signal imbalance may be manifested as spectral images, distortion, and increased bit error rates, for example. Some degree of quadrature signal imbalance arises naturally in all practical applications.

BRIEF DESCRIPTIONS OF THE DRAWINGS

Various embodiments in accordance with the present disclosure will be described with reference to the drawings, in which.

Figure 1:
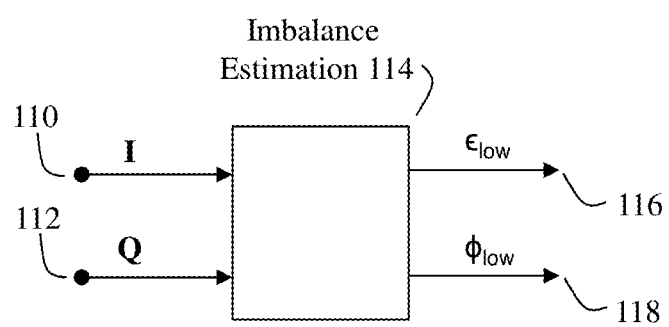
FIG. 1 shows a quadrature signal imbalance estimation device in accordance with an embodiment.
Figure 5:
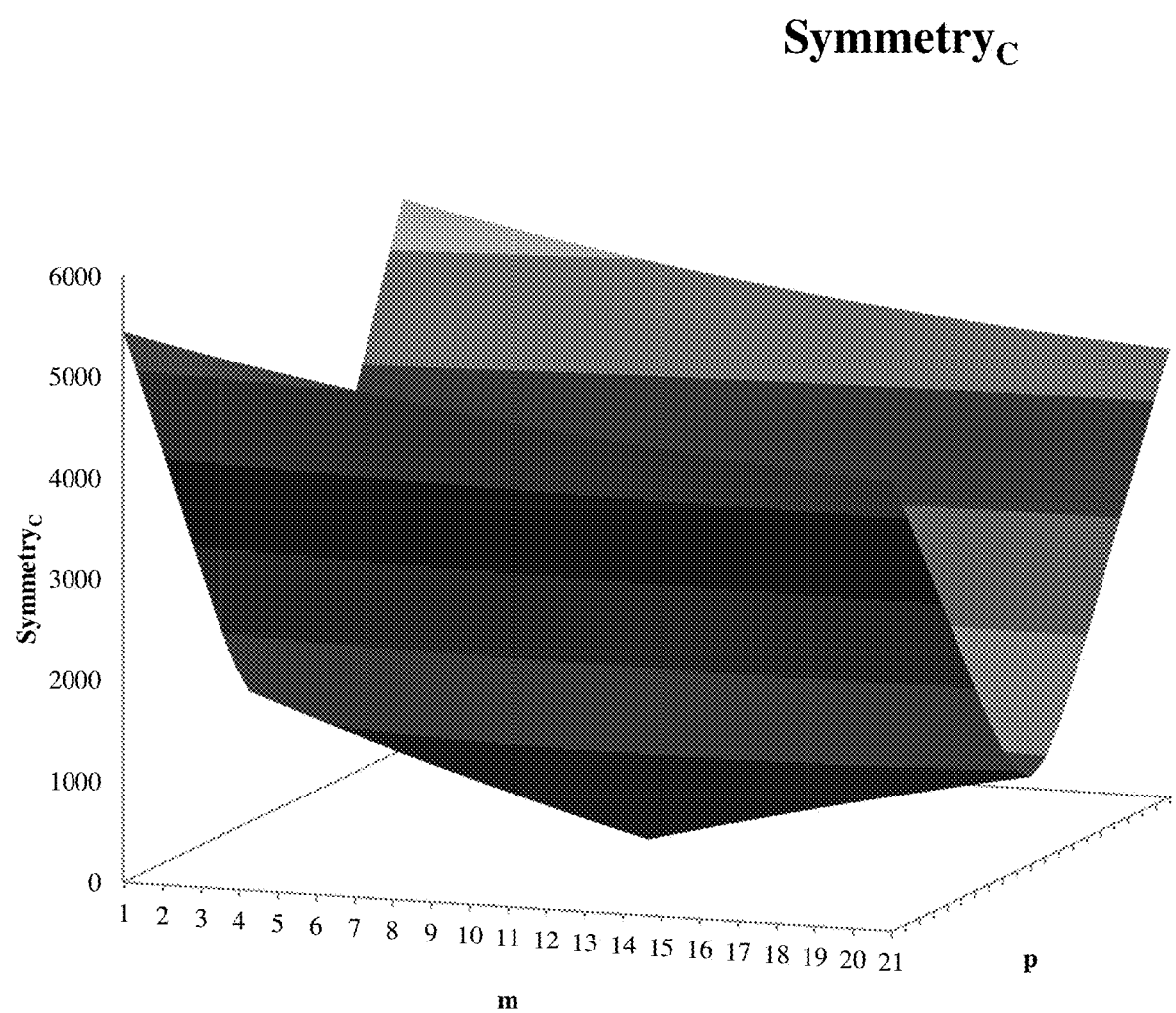
FIG. 5 is a graph of a symmetry surface generated based on amplitude imbalance and phase imbalance in accordance with various embodiments.
Figure 5A:
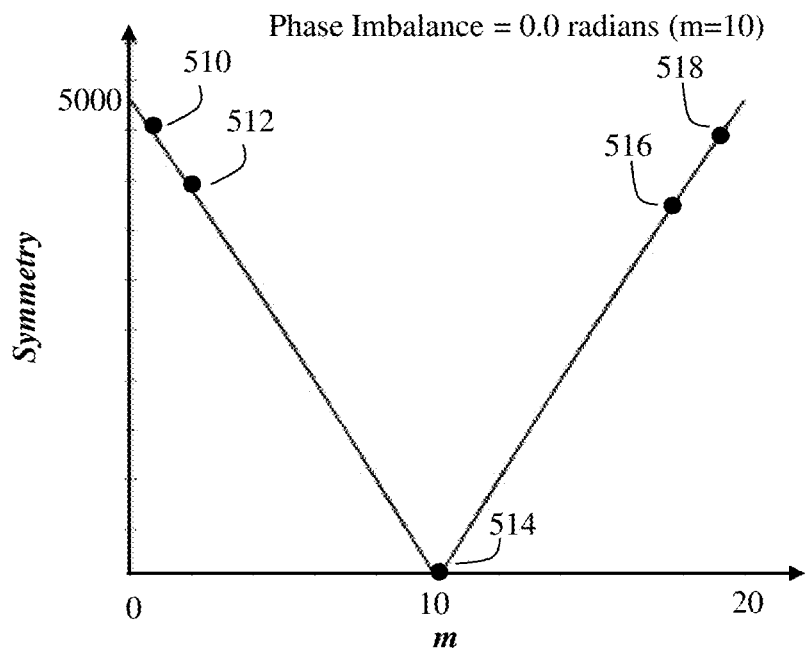
Figure 5B:
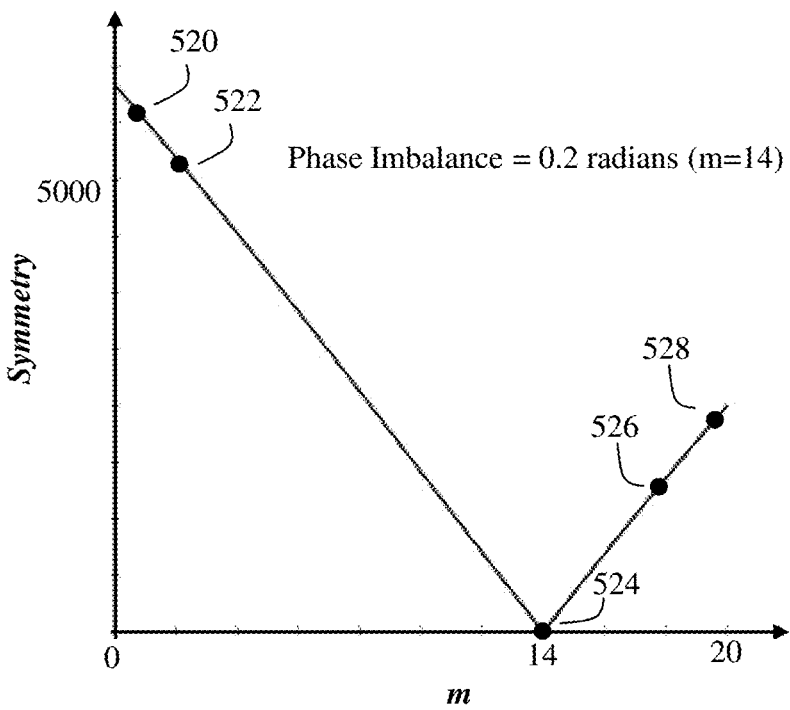
Figure 5C:
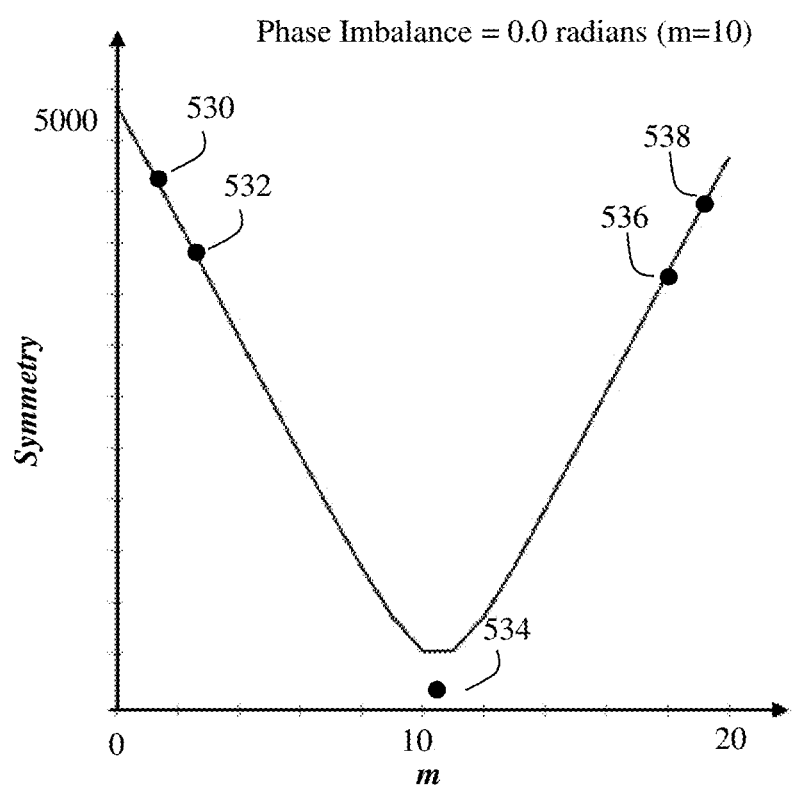
Figure 6:
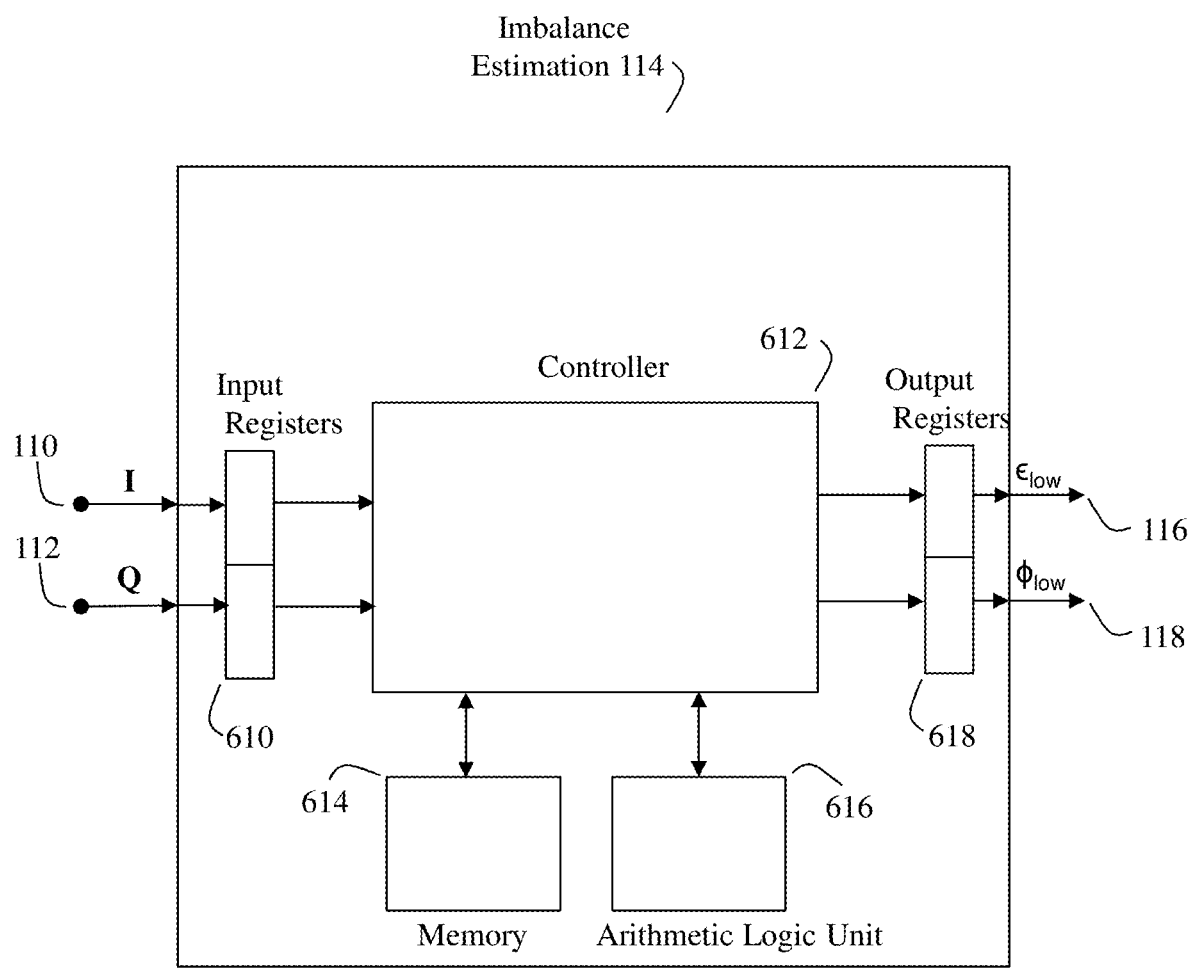

FIGS. 5A, 5B, and 5C illustrate example graphs of symmetry in accordance with various embodiments;

FIG. 6 illustrates an example quadrature signal imbalance estimation device, such as the one shown in FIG. 1.

REFERENCE NUMERALS

110 I signal bus
112 Q signal bus
114 imbalance estimation device
116 amplitude imbalance estimate bus
118 phase imbalance estimate bus
210 quadrature imbalance correction block
212 corrected I signal bus
214 corrected Q signal bus
310 −100 Hz peak
312 +250 Hz peak
314 −250 Hz image peak
316 +100 Hz image peak
410 first parameter range block
412 second parameter range block
414 assemble record block
416 imbalance correction block
418 Fourier transform block
420 symmetry calculation block
422 identify low symmetry block
510 point P0
512 point P3
514 point PV
516 point P17
518 point P20
520 point P0'
522 point P3'
524 point PV'
526 point P17'
528 point P20'
530 point P0"
532 point P3"
534 point PV"
536 point P17"
538 point P20"
610 input registers
612 controller
614 memory device
616 arithmetic Logic Unit
618 output registers

DETAILED DESCRIPTION

Quadrature signal imbalance causes undesired spectral images and other unwanted effects and artifacts in digital systems. Conventional approaches to estimating and mitigating imbalance may be unduly complex, slow, power-hungry, and inaccurate. The embodiments overcome these disadvantages by estimating the true imbalance by essentially searching for a value of imbalance that, when used to correct a quadrature signal, reduces a spectral symmetry. When the resulting imbalance estimate is used as an input to a quadrature imbalance correction device, undesired spectral images and other unwanted effects may be mitigated.

Referring to FIG. 1, a quadrature imbalance estimation device 114 is shown. Imbalance estimation device 114 is an example of a computing system comprising a computing device processor and a memory device. In certain embodiments, imbalance estimation device 114 may comprise, for example, a controller, a memory, an arithmetic logic unit, and input and output registers that can be used to perform the operations described below. Inputs I signal bus 110 and Q signal bus 112 of imbalance estimation device 114 can be coupled to a quadrature signal comprising digital sample values of an I signal and a Q signal, respectively. The coupling may comprise wired, wireless, or optical coupling, for example. The I, Q signals referred to here are generally understood to be baseband signals. If the system that produced the quadrature signal is a Doppler sonar or radar system, for example, the frequency of the wave energy reflected from a target may be much higher than the Doppler shift, for example, a radio frequency (r.f.) or an intermediate frequency (i.f.). However, in such systems, a baseband quadrature signal having the Doppler shift frequencies can be generated by conventional mixing or sampling, for example, as mentioned above, and coupled to busses 110, 112. Busses 110, 112 may be serial or parallel busses. Imbalance estimation device 114 can include two output busses—amplitude imbalance estimation bus 116, and phase imbalance estimation bus 118. Busses 116, 118 may be serial or parallel busses, and can be used to convey digital values of estimate $\epsilon_{low}$ of amplitude imbalance E and estimate $\phi_{low}$ of phase imbalance $\phi$, respectively. In this example, $\epsilon$ is a fractional amplitude imbalance (versus a ratio or gain; see discussion of Churchill correction, below), and has a value of 0 if I, Q are in perfect amplitude balance. Imbalance estimation device 114 generates outputs 116, 118 as follows.

In many applications, the frequency spectrum of a balanced quadrature signal is a two-sided asymmetrical function of frequency. If quadrature imbalance is introduced, however, a particular symmetry of the spectrum, with respect to the center of its frequency span, will increase.

The embodiments assume that the imbalance parameters fall within known ranges that are substantially consistent with expected variations in an application's system design. A quadrature imbalance correction is done multiple times, each time using a different trial value of amplitude imbalance $\epsilon$ and phase imbalance angle $\phi$ selected from within those ranges. A spectral symmetry, alluded to above, is generated for each resulting (differently corrected) signal record, thereby generating a group of symmetry values. A symmetry point having a relatively low symmetry value with respect to the other symmetry points in this group, is identified within, or inferred from, this group. The amplitude imbalance $\epsilon$ and phase imbalance $\phi$ that correspond to the low symmetry point can be selected as estimates $\epsilon_{low}$ and $\phi_{low}$ of the true amplitude imbalance and true phase imbalance, respectively. As mentioned above, these estimates may subsequently used as input parameters to a quadrature imbalance correction device, which may be employed to correct any subsequent quadrature signal, thereby mitigating quadrature signal imbalance and reducing one of a number of artifacts or errors of the subsequent quadrature signal by at least a threshold amount. The threshold can be set to correspond to a satisfactory accuracy for any given application.

Triangulation is a particularly appropriate method for identifying a low symmetry, given the essentially triangular nature of the particular disclosed symmetry function. Triangulation allows the determination of a low symmetry point by generating as few as four symmetry points, thereby permitting embodiments to track rapidly changing imbalance.

The subject embodiments may use blind imbalance estimation without interruption of the normal collection of quadrature signal data; in other words, no artificial pilot tones, test tones, or training data are necessarily required by the embodiments.

The subject embodiments substantially comprise a nulling method, which is not subject, as some prior art devices and methods are, to errors in intermediate parameter estimates.

In practical applications, quadrature signals are usually contaminated, to some extent, by additive noise and phase noise. Methods for estimating and mitigating quadrature imbalance may be distinguished by their performance in the presence of such noise. The embodiments deliver superior accuracy versus prior art devices, as manifested in relatively higher Image Rejection Ratio (IRR), over a wide range of signal-to-noise ratios (S/N ratios).

Figure 2:
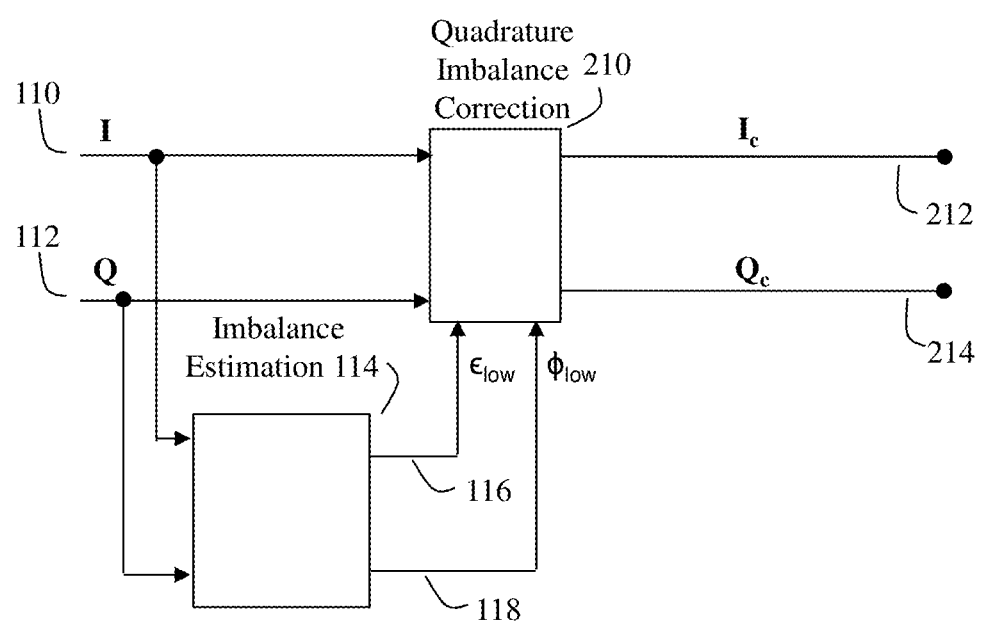
FIG. 2 shows a block diagram of a system for mitigating quadrature signal imbalance that includes the device of FIG. 1 in accordance with an embodiment.

Now referring to FIG. 2, a block diagram of a system for mitigating quadrature signal imbalance, as mentioned above, is shown. Here, I signal bus 110 and Q signal bus 112 can be connected to imbalance estimation device 114 and a quadrature imbalance correction block 210. Imbalance estimation device 114 first generates an estimate $\epsilon_{low}$ of amplitude imbalance $\epsilon_I$, and an estimate $\phi_{low}$ of phase imbalance $\phi_{low}$ 118. These estimates can be then provided to quadrature imbalance correction block 210 via amplitude imbalance estimation bus 116 and phase imbalance estimation bus 118. Quadrature imbalance correction block 210 subsequently uses the imbalance estimates to correct quadrature imbalance in the I and Q signals conveyed by I signal bus 110, Q signal bus 112, thereby producing a corrected quadrature signal comprising corrected I signal $I_c$ conveyed by a corrected I signal bus 212 and a corrected Q signal $Q_c$ conveyed by a corrected Q signal bus bus 214. If the quadrature signal is not time-invariant, the subsequent quadrature signal imbalance associated with the subsequent I and Q signals may differ from that of the signal initially supplied to imbalance estimation device 114; in this case, the ability of device 114 to track rapid changes in imbalance may be important.

To implement quadrature imbalance correction block 210 (that uses as input parameters estimates of amplitude imbalance E and phase imbalance $\phi$) the correction given by Churchill (CHURCHILL, et al., The Correction of I and Q Errors in a Coherent Processor, IEEE Transactions on Aerospace and Electronics Systems, Vol. AES-17, No. 1, January 1981, IEEE, 445 Hoes Lane, Piscataway, N.J. 08854-4141) may be implemented, for example. From Churchill, the original unbalanced I, Q component samples can each be treated as a (non-orthogonal) vector in the complex plane. For example, each complex sample value C in a record C(j) may have the form $$C = I + iQ.$$

where j is a sample number, and i is the unit imaginary number. If estimates of amplitude imbalance $\epsilon$ and phase imbalance $\phi$ are available, we can orthogonalize the vectors and balance their amplitudes by $$I_c = a*I$$

$$Q_c = b*I + Q$$

where $$a = \frac{\cos\phi}{1+\varepsilon}$$

and $$b = \frac{\sin\phi}{1+\varepsilon}$$

and where $I_c$, $Q_c$ are the corrected forms of the original I, Q quadrature components. Churchill's correction, when applied to an imbalanced I, Q signal, produces improvements in quadrature balance that are limited primarily by any errors in the estimates of amplitude imbalance E and phase imbalance $\phi$.

In accordance with various embodiments, if a power spectral density function is computed over a bipolar frequency range for a complex quadrature signal produced by a Doppler detection system, such as radar or sonar, for example, the magnitudes of the frequencies of the indications can be proportional to the speeds of the targets, and the polarities of the frequencies correspond to the directions of the targets (that is, moving towards, or away from, the transmitter).

Figure 3A:
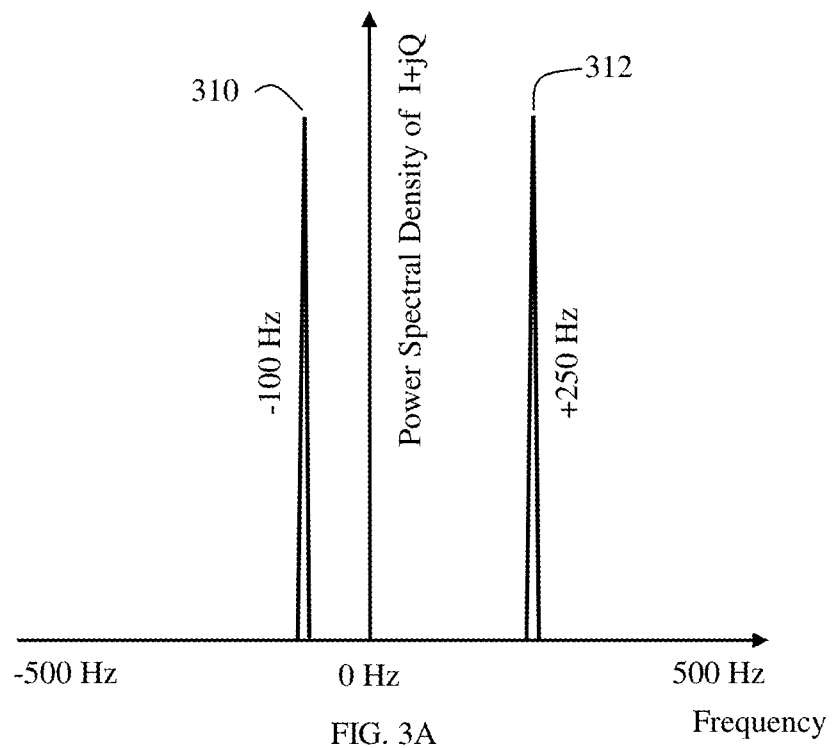
FIG. 3A is a graph of power spectral density of a simulated quadrature signal with 0 imbalance in accordance with an embodiment.

FIG. 3A illustrates an example of such a power spectral density function. In this example, the quadrature signal for which the power spectral density was generated nominally has two frequency components of equal amplitude, having baseband frequencies (for example, after image-rejecting direct conversion in a radar system) of 100 Hz and 250 Hz. The resulting I, Q signal components corresponding to the 100 Hz baseband frequency in this example are 100 Hz sinusoids. For each frequency component, the I, Q sinusoids are of nominally equal amplitude, the magnitude of the I, Q vector sum is equal to the magnitude of the baseband quadrature signal, and the I, Q sinusoids have a nominal 90.0° phase difference between them. However, while, for the 100 Hz component, the Q signal is phase shifted from that of the I signal by nominally +90.0°, for the 250 Hz component, the Q signal is phase shifted by nominally −90.0°. These (opposite polarity) phase shifts of I vs. Q for the two different frequencies are characteristic of quadrature signals that might be expected in a radar or sonar system, for example, when measuring the speeds of two targets moving at different speeds in opposing directions.

FIG. 3A represents a spectrum of the balanced quadrature signal described above for the frequency range −500 Hz to +500 Hz. In this example the spectrum has two spectral peaks, a −100 Hz peak 310, and a +250 Hz peak 312. As mentioned above, the signs of the frequencies correspond to positive and negative phase shifts between the 100 Hz and 250 Hz components, respectively. The negative and positive frequencies may ultimately be interpreted as corresponding to negative and positive polarities, respectively, of target speeds or directions.

Note that the results of FIG. 3A, for quadrature signal analysis, are in marked contrast to the spectrum that would be obtained by analyzing a single real-valued signal, such as, for example, just the I signal. The spectrum of just the I signal would include four equal-amplitude peaks mirrored about 0 Hz, at −250 Hz, −100 Hz, +100 Hz, and +250 Hz (not shown). No information regarding the directions of target motions could be gleaned from such spectra. Incidentally, such spectra (not shown) could also be interpreted as the results of quadrature signal analysis for a system with a worse-case quadrature imbalance (essentially missing one of the two quadrature components, I or Q) and having Image Rejection Ratio (IRR)=0 dB.

Figure 3B:
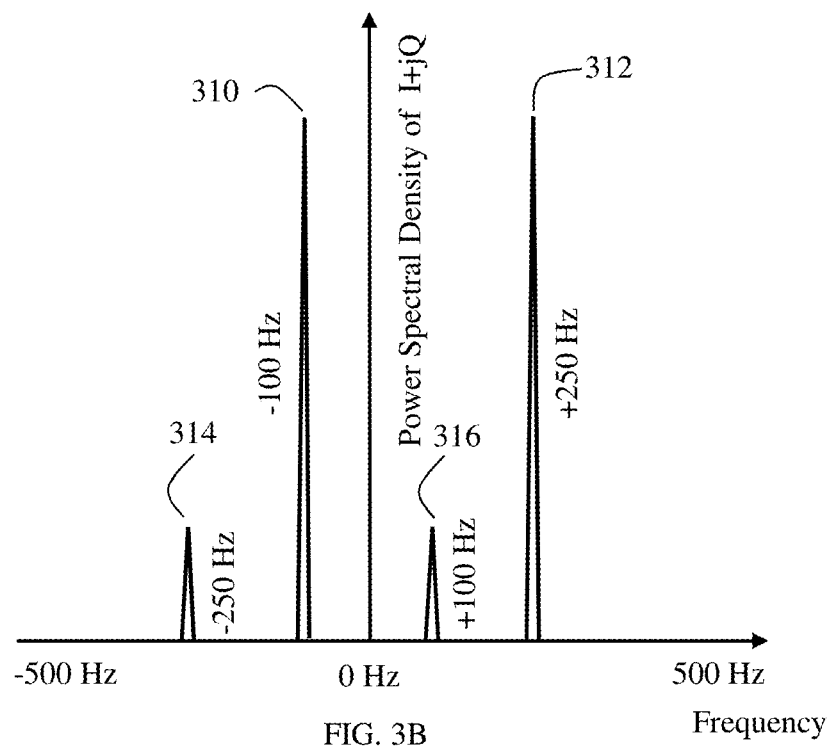
FIG. 3B is a graph of power spectral density of a simulated quadrature signal with significant imbalance in accordance with an embodiment.

FIG. 3B illustrates the spectral images that may occur when a moderate amount of uncorrected quadrature imbalance is present. FIG. 3B shows the results of a second simulation case, in which amplitude imbalance of about 0.1=10.0% and phase imbalance of about 0.2 rad=11.5° were introduced. No imbalance correction was applied. The desired peaks −100 Hz peak 310 and +250 Hz peak 312 are present, as in FIG. 3A. However, in FIG. 3B, the moderate amount of quadrature imbalance causes significant additional, undesired peaks, namely −250 Hz image peak 314 and +100 Hz image peak 316. It is an object of the embodiments to provide amplitude imbalance estimate $\varepsilon_{low}$ and phase imbalance estimate $\phi_{low}$ that may be used to mitigate such image peaks as 314, 316.

Figure 4:
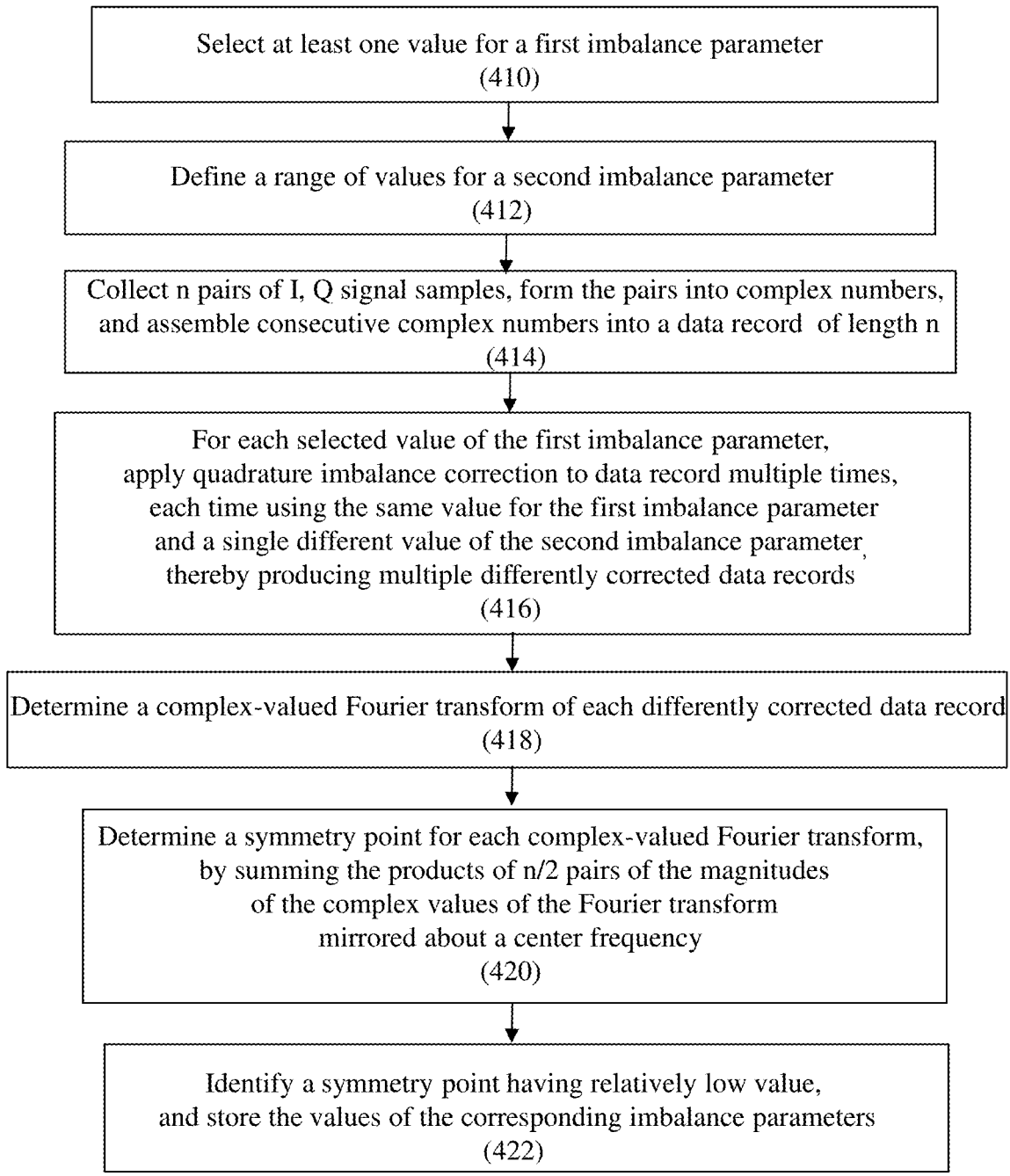
FIG. 4 is a flow chart for operations of an embodiment of the imbalance estimation device of FIG. 1 in accordance with various embodiments.

FIG. 4 illustrates an example process for estimating the imbalance of a quadrature signal in accordance with various embodiments. This process can be performed by a computing system comprising a computing device processor and a memory device, for example. In certain embodiments, these operations may be performed, for example, using a controller, a memory, an arithmetic logic unit, and input and output registers of imbalance estimation device 114. It should be understood that, for any process discussed herein, there can be additional, fewer, or alternative steps, performed in similar or different orders, or in parallel, within the scope of the various embodiments unless otherwise stated.

In this example, in first parameter range block 410, at least one value for a first imbalance parameter (e.g., either amplitude imbalance or phase imbalance), is selected and in certain embodiments stored in a memory of imbalance estimation device 114. The value represents a trial estimate of the first imbalance parameter. As mentioned above, in the embodiments, the true amplitude imbalance and true phase imbalance angle can be assumed to fall within certain ranges, based on the design of the system that generated the quadrature signal. An estimate may be determined by selecting a value of the first imbalance parameter that satisfies a threshold value of symmetry, for example. Alternatively, the value may be chosen, for example, to be the nominal or expected or average value of the first imbalance parameter. For example, a nominal value of phase imbalance $\phi$ may be $\phi_{low}$=0. If the first imbalance parameter is, instead, amplitude imbalance E, a nominal value of (fractional) amplitude imbalance $\varepsilon$ may be $\varepsilon_{low}$=0. Alternatively, a function incorporating the ratio of measures of amplitudes of the I, Q quadrature signals may be used to estimate $\varepsilon_{low}$. For example, fractional amplitude imbalance E (as defined in Churchill, above) may be estimated as a function of the ratio of the root-mean-square value (RMS) of the in phase signal I to the root-mean-square value of the quadrature phase signal Q, as follows:

$$\varepsilon_{low}=[RMS(I)/RMS(Q)]-1$$

where RMS(I) is the root-mean-square value of I after any direct current (DC) bias has been substantially eliminated, and RMS(Q) is the root-mean-square value of Q after any DC bias has been substantially eliminated. DC bias may mitigated in any conventional manner, for example, by highpass filtering quadrature signals I, Q, or by subtracting the average value of each of the I, Q signals from itself.

In second parameter range block 412, a range of values for a second imbalance parameter (the remaining parameter of either amplitude imbalance or phase imbalance), is chosen and in certain embodiments stored in a memory of imbalance estimation device 114. The number of values and their spacing may depend upon the manner in which a low value of symmetry is identified (in identify low symmetry block 422, below). For example, the range of values may simply be a group of approximately equally-spaced values in a range within which the true value of the second parameter is expected to be, as dictated by the design of the system that uses the quadrature signals. Alternately, for example, if a triangulation technique is used to identify a low value of symmetry, as few as four values may be defined, with two values near each of the two ends of the range within which the true value of the second parameter is expected to be, as dictated by the design of the system that uses the quadrature signals. Triangulation is discussed further below.

In assemble record block 414, imbalance estimation device 114, for example, can determine a plurality of samples of the quadrature signal. These samples may comprise in-phase data I and quadrature phase data Q. n pairs of consecutive I, Q samples, including at least the first and second samples, can be collected and assembled in chronological order and, in certain embodiments, stored in input registers of imbalance estimation device 114. This group of samples will be subsequently interpreted as a complex number data record C(j), where j is an index variable that represents sample number. C(j) has n complex sample values. Each $j^{th}$ complex sample value C in record C(j) is a complex number. Each complex number is generated by pairing simultaneous samples of I and Q (or corresponding samples of I and Q, if phase-shifted sampling is used), and multiplying either the I or Q sample by the imaginary unit i. For example, each complex sample value C in record C(j) may have the form $$C=I+iQ.$$

At least one complex number data record is assembled. This complex number data record is a complex representation of the quadrature signal, and is associated with the quadrature signal imbalance that includes the first imbalance parameter and the second imbalance parameter.

Before a complex number record is used, any DC bias component or average value in signals I, Q may be mitigated. DC bias may mitigated in any conventional manner, for example, by highpass filtering signals I, Q, or by subtracting the average value of each of the signals from itself.

In imbalance correction block 416, a quadrature imbalance correction technique or algorithm, for example, that disclosed by Churchill (above), may be applied multiple times to the complex number data record C(j). For each of the P values selected for the first imbalance parameter in block 410, the quadrature imbalance correction algorithm may be applied M times, each $m^{th}$ time using the same $p^{th}$ value for the first imbalance parameter and a single different $m^{th}$ value of the second imbalance parameter defined in block 412, to produce a group of differently corrected complex number data records, each corresponding to a unique pairing of imbalance parameter values. In other words, the differently corrected complex number data records correspond to respective first imbalance parameter values and respective second imbalance parameter values. This process begins by using a first value $p_1$ of the first imbalance parameter M times, and continues by using each of the remaining (P−1) values of the first imbalance parameter M times, essentially generating the elements of a P-element matrix of arrays C(j,m). Each array C(j,m) corresponds to a different $p^{th}$ value of the first imbalance parameter (if more than one value of the first imbalance parameter is defined). Each $m^{th}$ complex number data record in C(j,m) corresponds to a single different $m^{th}$ value of the second imbalance parameter defined in block 412, and each value of index variable j corresponds to a different sample in an $m^{th}$ complex number data record. The differently corrected complex number data records can be stored, in certain embodiments, in a memory.

Each sample in one of the corrected complex number records of array C(j,m) is a complex number and may be represented as an modified sample of the original C with new value $$C=I_c+iQ_c$$

where $I_c$ is a corrected I signal, and $Q_c$ is a corrected Q signal.

In Fourier transform block 418, a Fourier transform technique is used on the set of corrected complex representations of the quadrature signal to generate a set of complex-valued spectra; that is, a Fourier transform of each of the differently corrected complex number data records in each array C(j,m) is generated. A specific discrete-time example of the mathematical operation performed by Fourier transform block 418 is $$F_{C_{k,m}} := \sum_{j=0}^{(n-1)} C(j,m) \cdot e^{-2i\cdot\pi\cdot\frac{k}{n}\cdot j}$$

where $F_C$ comprises an array of complex-valued spectra with each different $m^{th}$ spectrum corresponding to a different $m^{th}$ value of the second imbalance parameter, k is an index number corresponding to the frequency of a sample in an $m^{th}$ spectrum, n is the number of samples in a time record, as well as the number of samples in each $m^{th}$ frequency spectrum, i is the unit imaginary number, and C(j,m) is the corrected complex number data record array defined in block 416. Each $k^{th}$ element of a $m^{th}$ spectrum $F_C$ may, in general, be a complex number. A different array $F_C$ is generated for each different value of the first imbalance parameter (if more than one value of the first imbalance parameter is defined).

In symmetry calculation block 420, first, the magnitude of each sample of each complex-valued spectra $F_C$ is generated, thereby producing positive real-valued magnitude spectra, that is, a power spectral density function. Then, a symmetry value is generated for each of the magnitude spectra by multiplying pairs of power spectral densities (or samples thereof) that are approximately equidistant in frequency from a center frequency, and summing the products. To conceptualize this generation of symmetry in terms of graphical methods, it is like first making a plot of magnitude spectra on a transparent sheet, then folding that plot along a vertical line at its center frequency, and finally, quantifying the resulting overall amount of overlap of spectral peaks between the two folded portions. Referring to FIG. 3A (with zero quadrature imbalance) one can see that, if the plot were folded at 500 Hz onto itself, no overlap of peaks would occur; this corresponds to zero symmetry. In contrast, referring to FIG. 3B (with significant quadrature imbalance), if it were folded at 500 Hz onto itself, peaks 310 and 316 would overlap, and peaks 314 and 312 would overlap; this corresponds to a non-zero symmetry. A specific example of a symmetry equation implemented by imbalance estimation device 114 is as follows:

$$\text{Symmetry}_{C_m} := \sum_{j=1}^{(\frac{n-1}{2})} |F_C(j, m)| \cdot |F_C(n-j, m)|$$

where j (the first argument of $F_C$) is now an index variable corresponding to frequency, m (the second argument of $F_C$) is again an index variable whose value corresponds to a particular $m^{th}$ value of the second imbalance parameter, and n is the number of frequency samples in each $m^{th}$ complex spectrum $F_C$. $\text{Symmetry}_C$ is an array of positive real numbers with m elements, each element corresponding to the value for the first imbalance parameter selected in block 410 and a different $m^{th}$ value of the second imbalance parameter. If more than one value of the first imbalance parameter was defined, a separate and, in general, different $\text{Symmetry}_C$ will be generated, each $\text{Symmetry}_C$ corresponding to a different value of the first imbalance parameter.

Identify low symmetry block 422 performs the function, alluded to above, of identifying a relatively low symmetry value relative to the symmetry points determined in symmetry calculation block 420, and, in certain embodiments, storing the values of the corresponding imbalance parameter estimates $\epsilon_{low}$ and $\phi_{low}$ in output registers of imbalance estimation device 114; these values of $\epsilon_{low}$ and $\phi_{low}$ comprise a quadrature signal imbalance estimate. The relatively low symmetry value can satisfy a selection criterion, such as being the lowest symmetry point determined in symmetry calculation block 420, or being approximately the lowest symmetry point that is able to be inferred from the points determined in symmetry calculation block 420, or being below a selected value of symmetry, for example. Different methods of identifying a relatively low value of symmetry will now be discussed in more detail.

FIG. 5 shows a $\text{Symmetry}_C$ function that was generated for a range of values for index variables m and p (corresponding to a range of values of imbalance parameters $\epsilon$ and $\phi$, respectively). The $\text{Symmetry}_C$ function may substantially be interpreted as a two-dimensional error surface, wherein the height of each point on the error surface is a measure of the error associated with applying a quadrature imbalance correction using the corresponding pair of test values for imbalance parameters $\epsilon$ and $\phi$.

As FIG. 5 suggests, one algorithm for identifying a relatively low value of symmetry is to evaluate the $\text{Symmetry}_C$ surface over relevant ranges of multiple values of both imbalance parameters, as shown in FIG. 5, and sort through the matrix of resulting symmetry values to identify a relatively low symmetry point on the surface. Then, an estimate of true quadrature imbalance can be taken as the amplitude imbalance and the phase imbalance corresponding to the relatively low point on the surface. This algorithm may require the computation of a significant number of $\text{Symmetry}_C$ values.

Another approach is to forego analysis of the three-dimensional surface of FIG. 5, and, rather, to use a two-dimensional approach. This process may be started, for example, by estimating a first imbalance parameter using methods such as those discussed above for first parameter range block 410, and holding that parameter constant at the value of the resulting first imbalance parameter estimate. An estimate may be determined by selecting a value of the first imbalance parameter that satisfies a threshold level of symmetry, for example. Then the second, other, parameter may be varied, generating a plurality of corresponding symmetry values. Finally, a relatively low value of symmetry on the resulting two-dimensional symmetry function may be identified.

In FIG. 5, it may be seen that the shape of the three-dimensional symmetry surface is approximately that of an inverted quadrilateral pyramid. Therefore, if one of the two imbalance parameters of $\text{Symmetry}_C$ is held constant, the resulting two dimensional plot Symmetry may have a shape approximately of an inverted triangle.

FIG. 5A illustrates an example of such a two dimensional Symmetry plot, wherein amplitude imbalance is 0, and index variable m, now corresponding to phase imbalance, is varied. A minimum of Symmetry occurs at the vertex of the triangle, at point PV 514. This corresponds to the value of index variable m (m=10) for which the estimated phase imbalance is equal to the modeled true phase imbalance 0.0 radians, in this example. FIG. 5B illustrate the effect of changing the true phase imbalance. FIG. 5B illustrates a different example, in which the true phase imbalance corresponds to m=14 and phase imbalance 0.2 radians; here, vertex PV' 524 is at m=14.

Similarly to the case for the three-dimensional symmetry surface, the location of a relatively low value of symmetry on the two-dimensional graph (at the triangle vertices at points 514, 524 in FIGS. 5A, 5B) may be found by generating Symmetry for a full range of parameter values, and sorting through all the symmetry values and choosing a relatively low value.

Other known methods for estimating troughs in functions may be used in accordance with various embodiments. For example, one such approach utilizes the first derivative of the function, and then identifies zero-crossings of the first derivative, whose positions will correspond to those of the peak and trough locations in the original function. However, in the presence of noise, this method may produce spurious zero-crossings. Refinements of this method, incorporating extra processing elements, can be used to mitigate the effect of spurious zero-crossings caused by noise. First, for this application, troughs (versus peaks) are of interest, and therefore positive-going zero-crossings of the first derivative would be considered. Secondly, before identifying zero crossings in it, the first derivative function may be smoothed by a moving average filter or other lowpass filter. Thirdly, a minimum slope, called the slope threshold, may be defined to qualify zero-crossings. That is, zero-crossings with slopes less than the slope threshold will be ignored. Finally, the search interval for zero crossings may be limited to intervals over which the original symmetry function has a minimum amplitude, called the amplitude threshold.

As for the three-dimensional case, since the algorithms of the preceding two paragraphs generally require generation of Symmetry over a continuous range of an imbalance parameter, they may require the computation of a significant number of $\text{Symmetry}_C$ values.

Another method for identifying a relatively low value of symmetry is to use triangulation. Triangulation is a method that was historically used with pencil and paper to manually identify a peak in a graph of a function, by constructing a triangle shape around the peak, with the sides of the triangle tangent to the sides of the peak.

Triangulation is well-suited to this application, at least because, in the absence of noise, the nominal shape of the particular Symmetry function defined herein is triangular. Therefore, the shape of the curve fitting function nominally matches the shape of the Symmetry function. Furthermore, with triangulation, a relatively low point on Symmetry can be located by generating as few as four values of Symmetry.

Therefore the parameter estimation for triangulation can have a relatively low computational loading, and, consequently, can have relatively fast adaptation speed, allowing embodiments to track quickly changing imbalance parameters. Finally, triangulation may be less susceptible to noise errors than the other methods mentioned above, in part because the portions of Symmetry function used for triangle parameter identification (the outer portions of the triangle shape, nominally distant from the triangle's vertex) may depend more on desired signal energy than on noise energy.

In the embodiments, triangulation comprises computationally constructing a triangle shape around a trough in the Symmetry function, with the sides of the triangle tangent to the sides of the trough. The sides of the triangle comprise two lines, so the triangle parameters to be estimated can be two line slopes and two line intercepts. Given estimates for these triangle parameters, a closed-form equation may then be used to obtain an estimate of the imbalance parameter (amplitude imbalance or phase imbalance).

In FIG. 5A, the minimum of Symmetry occurs at the vertex of the triangle, at point PV 514. The object of triangulation here is to estimate the value of the imbalance parameter associated with point PV 514. Here, the Symmetry function itself may be assumed to define the legs of a triangle. Therefore, if Symmetry is evaluated at two points near each boundary of the imbalance parameter range (in this example, a range of m), the location at which the legs cross may be obtained, and the imbalance parameter estimated.

For example, in FIG. 5A, four Symmetry values at point P0 510, point P3 512, point P17 516, and point P20 518, located at values of index variable m equal to 0, 3, 17, and 20, respectively, are shown. If Symmetry is evaluated at these four points, the following equations may be used to determine the rational number value $m_V$ of index variable m at point 514 (the vertex of the triangle):

$$m_A = \frac{\text{Symmetry}(P0) - \text{Symmetry}(P3)}{0 - 3}$$

$$m_B = \frac{\text{Symmetry}(P17) - \text{Symmetry}(P20)}{17 - 20}$$

$$b_A = \text{Symmetry}(P0) - m_A \cdot 0$$

$$b_B = \text{Symmetry}(P17) - m_B \cdot 17$$

$$m_V = \frac{b_B - b_A}{m_A - m_B}$$

where $m_A$ is the slope of the left leg of the triangle, $m_B$ is the slope of the right leg of the triangle, $b_A$ is the y-intercept of the left leg of the triangle, $b_B$ is the y-intercept of the right leg of the triangle, and, again, $m_V$ is a rational number value of index variable m at point 514 (the vertex of the triangle). The preceding is just a representative example of the operations that may be used to find the location of the trough in the Symmetry function using triangulation.

Given $m_V$, a corresponding imbalance parameter with engineering units (of, say, degrees or radians, for example) may be determined by simply multiplying $m_V$ by a scale factor that relates the index variable m to the imbalance parameter.

When no noise is present, an embodiment employing triangulation, as described above, may provide substantially error-free estimates of imbalance parameters. However, to evaluate the performance of the embodiments in the presence of noise, a simulation case was run wherein noise was introduced into the I, Q signals conveyed by busses 110, 112.

Referring to FIG. 5C, a third plot of Symmetry, determined as described above, with generally the same conditions as for FIG. 5A, is shown. In this example, however, the I, Q signals were contaminated with random additive gaussian white noise (AGWN) and phase noise. FIG. 5C shows that, when random noise is present, the trough in Symmetry becomes less sharp, and the value of index variable m at which a relatively low or minimum value of Symmetry occurs may be shifted by a random amount. In the case of FIG. 5C, for example, the minimum in Symmetry 330 was expected at m=10, as for the simulation of FIG. 5A; however, due to noise, a minimum occurs below vertex point PV" 534 (where the two line segments defined by points P0" 530, P3" 532, P17" 536, and P20" 538 intersect), at about m=11. This illustrates that estimated phase imbalance $\phi_{low}$ will have some random error if the I, Q signals are contaminated with random additive noise or phase noise.

If the imbalance is substantially time invariant, this random error may be reduced, thereby boosting IRR, by using longer time records, or by combining multiple imbalance estimates based on multiple time records. These techniques will essentially increase acquisition time $T_{acq}$. The techniques substantially comprise identifying in a repetitive manner a symmetry value that satisfies a selection criterion. This can be done by determining an initial plurality of samples of the quadrature signal and using it to identify an initial symmetry value that satisfies a selection criterion; and then determining a subsequent plurality of samples of the quadrature signal and using it to identify a subsequent symmetry value that satisfies a selection criterion. The corresponding initial and subsequent first imbalance parameter estimates can be combined to determine a first imbalance parameter combined estimate; and the corresponding initial and subsequent second imbalance parameter estimates can be combined to determine a second imbalance parameter combined estimate. The combining operation may comprise simple or cumulative running averages, or other filtering such as weighted averages or finite impulse response lowpass filtering, of multiple imbalance estimates, for example. Such combining will tend to mitigate random errors in the resulting combined estimates.

Random errors may be expected to diminish approximately in proportion to the square root of the total duration of the data acquisition time. However, the increase in image rejection ratio (IRR) due to a reduction in random error in the phase imbalance estimate, for example, is greater than would be expected for a linear relationship between the two, because their actual relationship is highly nonlinear. IRR approaches infinity as phase imbalance error approaches 0, so at high IRRs, small reductions in the error in the phase imbalance estimate cause disproportionately large increases in IRR. This fact can be exploited by the embodiments to achieve high IRRs, as will be shown below.

Hence, in the presence of noise, the time $T_{update}$ required to make an estimate of the imbalance parameters will depend, in part, on the desired image rejection ratio (IRR). The IRR is affected by the quadrature signal's signal-to-noise ratio (S/N ratio), since noise will produce random error in imbalance estimates.

When triangulation is used to estimate the location of a relatively low value of Symmetry for quadrature signals that are contaminated with noise, to the extent that the true imbalance is near an end of the defined range of the imbalance parameter (versus near the middle of the defined range), the noise may bias the location estimate. To mitigate this bias, the symmetry value that satisfies a selection criterion may be identified in an iterative manner, as follows. The process can begin with an initial plurality of samples of the quadrature signal, thereby generating an initial second imbalance parameter estimate, as before, for example. A subsequent plurality of samples of the quadrature signal and the initial second imbalance parameter estimate can serve as initial values for a second iteration. In the second iteration, the range for the second imbalance parameter values can be centered on the initial second imbalance parameter estimate. A subsequent symmetry value that satisfies a selection criterion can be identified, and a corresponding subsequent second imbalance parameter estimate made. The initial second imbalance parameter estimate and the subsequent second imbalance parameter estimate can be combined to determine a combined estimate. Combining may comprise averaging or weighted averaging of the initial second imbalance parameter estimate and the subsequent second imbalance parameter estimate, for example; alternatively, combining may comprise completely discarding the initial second imbalance parameter estimate and using only the subsequent second imbalance parameter estimate. Hence, random error in the combined estimate can be mitigated, as before, but the bias error may also be mitigated by centering the imbalance parameter range for each new iteration (or, in other words, in each subsequent iteration) at the value of the imbalance parameter estimate determined in the prior or initial iteration.

Embodiments may be configured to sequentially alternate application of triangulation of the Symmetry function to each of the two imbalance parameters, for the purpose of further reducing random and bias error in the estimates. For example, triangulation of the Symmetry function might first be applied to the amplitude imbalance estimate, and then to the phase imbalance estimate, and then to the amplitude imbalance estimate again, and then to the phase imbalance estimate again, and so on, in multiple iterations.

If the quadrature imbalance to be mitigated is invariant over time, the time taken by imbalance estimation device 114 to produce the parameters estimated phase imbalance $\phi_{low}$ and estimated amplitude imbalance $\epsilon_{low}$ may be substantially irrelevant. However, if the imbalance changes significantly with time, it may be desirable to track the changes by periodically updating the imbalance estimate. In this case, the time $T_{update}$ required by imbalance estimation device 114 to make an estimate of the imbalance parameters, which may also be regarded as a latency time, may be a performance attribute of interest.

The minimum $T_{update}$ will be equal to the time $T_{acq}$ required to acquire one time record of samples of the I, Q signals, added to the signal processing time $T_{calculation}$, as follows:

$$T_{update} = T_{acq} + T_{calculation}$$

$T_{acq}$ is proportional to the number of samples in a time record, n, and inversely proportional to the sample rate of the quadrature signal, $f_s$, as follows:

$$T_{acq} = n/f_s$$

$T_{calculation}$ depends, in part, on the number and type of operations. $T_{calculation}$ also depends strongly on the particular hardware or software implementation the computing system comprising a computing device processor and a memory device, for example, imbalance estimation device 114. A general purpose computer may be used as a digital signal processor to implement imbalance estimation device 114 and quadrature imbalance correction block 210 in FIG. 2, and perform the operations of the flow chart in FIG. 4, as well as any of the other operations disclosed above. Alternatively, modern off-the-shelf digital signal processors (DSPs) may be used. They are available for about $30.00, are completely programmable, and can calculate a 128-point complex floating point fast Fourier transform (FFT) in about 2.0 us. To achieve even higher speeds, digital circuitry, field programmable gate arrays (FPGAs), or application specific integrated circuits may be used, for example; also, pipelining and parallel processing, or smaller record lengths, may be used. The devices of FIGS. 1, 2, and 6 (discussed below) can comprise various types and combinations of hardware and software, such as one or more of a general purpose computer, a digital signal processor (DSP), a field programmable gate array (FPGA), digital circuitry, or an application specific integrated circuit, in certain embodiments further comprising a memory device including instructions that, when executed by the computing device processor, cause the hardware to perform the operations of the embodiments. Alternatively, in accordance with certain embodiments, hardware can be configured or hard-wired to equivalently perform the operations of the embodiments by using hardware state machines, without actually fetching and executing software instructions from a memory device. Configuring may be permanent (one time), or may need to be repeated each time the hardware is powered.

Note that the speed at which quadrature imbalance correction block 210 corrects quadrature imbalance is substantially independent of the speed at which imbalance estimation block 114 generates estimated imbalances on busses 116, 118.

Referring to FIG. 6, an example quadrature signal imbalance estimation device, such as the one of FIG. 1, is shown. Imbalance estimation device 114 may comprise input registers 610 for storing records of I and Q signals, a controller 612 for performing sequencing of operations, executing control functions, and, in accordance with certain embodiments, reading and writing program and data information from and to memory, a memory device 614 for storing constants, data, and program instructions, an arithmetic logic unit 616 for performing mathematical operations, and output registers 618 for storing output results. These components may be used by imbalance estimation device 114 to perform the operations of FIG. 4. These components may also be used to perform other operations of the embodiments, such as triangulation (discussed below), for example. They may, in general, even be used to perform ancillary operations. For example, the components of imbalance estimation device 114 may also be used to perform the functions of quadrature imbalance correction block 210 of FIG. 2. The diagram of FIG. 6 is provided as just one example of the implementation of imbalance estimation device 114; many different variations of interconnections and components are possible, as will be apparent to a skilled practitioner.

Advantages

An advantageous aspect of the embodiments arises from the fact that, in many applications, an important undesired consequence of quadrature imbalance is the presence of image artifacts in the frequency spectrum of the quadrature signal. These image artifacts directly cause an increase in spectral symmetry, relative to what it would be for a signal with no imbalance. Since this unwanted symmetry is precisely the thing that is measured and reduced by the embodiments, the embodiments employ a very relevant measure of error in, and can be thereby uniquely suited to, such applications.

Another advantageous aspect of the embodiments is that they can be fast-acting relative to conventional devices, even in the presence of significant levels of additive noise. In particular, the use of triangulation to locate a relatively low value of symmetry permits embodiments to track rapidly changing imbalance.

In part, these advantages accrue due to the embodiments' intense focus of computational power on relevant aspects of the quadrature signal by calculating a symmetry function. The value of a single Symmetry point consolidates all of the results of the complex multiply and accumulates (MACs) of a Fourier transform, over its entire frequency span, into a single real number. For example, in the 100-sample record examples of Symmetry graphed in FIGS. 5A, 5B, and 5C, each Symmetry point consolidates the results of about 10,000 complex-valued MACs. This constitutes a significant averaging or filtering operation. This filtering attenuates the random errors in symmetry values caused by noise, and ultimately increases the accuracy of the imbalance parameter estimates for a given number of samples of the quadrature signal. Further, these advantages accrue due to the recognition and exploitation of the particular shape of the disclosed symmetry function. Because the symmetry function may have a nominally triangular shape, triangulation may be used to infer an accurate estimation of the location of a low symmetry value by generating as few as four symmetry points. This ultimately reduces overall computational loading and boosts adaptation speed.

Yet another advantageous aspect of the embodiments is that, as mentioned previously, the disclosed system of estimating phase imbalance essentially comprises a nulling method in which a quantity of interest—symmetry in a spectral function, corresponding to the degree of unwanted spectral images—is compelled towards zero or towards a minimum. Therefore, the accuracy of the disclosed method is not subject to degradation caused by scale factor errors in intermediate parameters. In contrast, many prior art systems make an estimate of phase balance which is then used to correct imbalance in an open-loop fashion; consequently, the accuracy of these prior art systems is limited by such scale factor errors. Therefore, the embodiments may provide better image rejection than these prior art systems.

Another advantageous aspect of the embodiments is that, even though the embodiments may be configured to continuously correct for time-varying quadrature imbalance, they do not require the selection of adaptive algorithm convergence parameters or feedback loop filter parameters (whose optimal values might depend upon robustness of stability, upon application noise conditions, or upon desired response time, for example). In this regard, the design, implementation, and deployment of the embodiments is simpler than for many prior art devices and methods.

Similarly, unlike for prior art devices and methods that use feedback control systems or adaptive compensators, the embodiments are not subject to instability or algorithm divergence; the embodiments can be unconditionally stable.

SUMMARY

Although the description above contains many specificities, these should not be construed as limiting the scope of the embodiments but as merely providing illustrations of some of several embodiments.

Various other configurations may also be used, with particular elements that are depicted as being implemented in hardware instead being implemented in software, firmware, or a combination thereof. One of ordinary skill in the art will recognize various alternatives to the specific embodiments described herein.

The various embodiments can be implemented in a wide variety of operating environments, which in some cases can include one or more user computers or computing devices which can be used to operate any of a number of applications. User or client devices can include any of a number of general-purpose personal computers, such as desktop or laptop computers running a standard operating system, as well as cellular, wireless and handheld devices running mobile software and capable of supporting a number of networking and messaging protocols. Such a system can also include a number of workstations running any of a variety of commercially available operating systems and other known applications for purposes such as development and database management. These devices can also include other electronic devices, such as dummy terminals, thin-clients, gaming systems and other devices capable of communicating via a network.

Embodiments can utilize at least one network that would be familiar to those skilled in the art for supporting communications using any of a variety of commercially available protocols, such as TCP/IP, FTP, UPnP, NFS, and CIFS. The network can be, for example, a local area network, a wide-area network, a virtual private network, the internet, an intranet, an extranet, a public switched telephone network, an infrared network, a wireless network and any combination thereof.

In embodiments utilizing a web server, the web server can run any of a variety of server or mid-tier applications, including HTTP servers, FTP servers, CGI servers, data servers, Java servers and business application servers. The server(s) may also be capable of executing programs or scripts in response requests from user devices, such as by executing one or more web applications that may be implemented as one or more scripts or programs written in any programming language, such as Java®, C, C# or C++ or any scripting language, such as Perl, Python or TCL, as well as combinations thereof. The server(s) may also include database servers, including without limitation those commercially available from Oracle®, Microsoft®, Sybase® and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch-sensitive display element or keypad) and at least one output device (e.g., a display device, printer or speaker). Such a system may also include one or more storage devices, such as disk drives, optical storage devices and solid-state storage devices such as randomaccess memory (RAM) or read-only memory (ROM), as well as removable media devices, memory cards, flash cards, etc.

Such devices can also include a computer-readable storage media reader, a communications device (e.g., a modem, a network card (wireless or wired), an infrared communication device) and working memory as described above. The computer-readable storage media reader can be connected with, or configured to receive, a computer-readable storage medium representing remote, local, fixed and/or removable storage devices as well as storage media for temporarily and/or more permanently containing, storing, transmitting and retrieving computer-readable information. The system and various devices also typically will include a number of software applications, modules, services or other elements located within at least one working memory device, including an operating system and application programs such as a client application or web browser. It should be appreciated that alternate embodiments may have numerous variations from that described above. For example, customized hardware might also be used, and/or particular elements might be implemented in hardware, software (including portable software, such as applets) or both. Further, connection to other computing devices such as network input/output devices may be employed.

Storage media and other non-transitory computer-readable media for containing code, or portions of code, can include any appropriate media known or used in the art, including storage media and communication media, such as but not limited to volatile and non-volatile, removable and non-removable media implemented in any method or technology for storage of information such as computer-readable instructions, data structures, program modules or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices, a non-transitory computer readable storage medium, or any other medium which can be used to store the desired information and which can be accessed by a system device. Based on the disclosure and teachings provided herein, a person of ordinary skill in the art will appreciate other ways and/or methods to implement the various embodiments.

I, Q signal busses 110, 112 are assumed to convey sampled discrete-time signals, so discrete-time Fourier transforms and Fast Fourier Transforms (FFTs) can be employed in the embodiments.

Some embodiments employ a symmetry function of two variables that defines a surface. This surface may be smoothed by conventional finite impulse response (FIR) spatial digital filters, to further reduce the effects of random noise.

Thus, the scope of the embodiments should be determined by the appended claims and their legal equivalents, rather than by the examples given.

We claim:

1. A computing system, comprising:
   a computing device processor;
   a memory device including instructions that, when executed by the computing device processor, enables the computing system to:
      obtain a quadrature signal;
      determine a plurality of samples of the quadrature signal, a first sample of the plurality of samples associated with first in-phase data and first quadrature phase data, a second sample of the plurality of samples associated with second in-phase data and second quadrature phase data;
      combine at least the first and second samples to generate a complex representation of the quadrature signal, the complex representation associated with a quadrature signal imbalance that includes a first imbalance parameter and a second imbalance parameter;
      use a quadrature imbalance correction technique on the complex representation of the quadrature signal to generate a set of corrected complex representations of the quadrature signal based at least in part on respective first imbalance parameter values and respective second imbalance parameter values;
      use a Fourier transform technique on the set of corrected complex representations of the quadrature signal to generate a set of complex-valued spectra;
      determine a plurality of symmetry values;
      identify a symmetry value of the plurality of symmetry values, or determine a symmetry value based at least in part on the plurality of symmetry values, that satisfies a selection criterion, the symmetry value corresponding to a first imbalance parameter estimate and a second imbalance parameter estimate.

2. The computing system of claim 1, wherein the instructions, when executed by the computing device processor, further enables the computing system to:
   analyze the quadrature signal to determine a quadrature signal imbalance estimate, the quadrature signal imbalance estimate comprising the first imbalance parameter estimate and the second imbalance parameter estimate.

3. The computing system of claim 2, wherein the first imbalance parameter is an amplitude imbalance and the second imbalance parameter is a phase imbalance, or the first imbalance parameter is a phase imbalance and the second imbalance parameter is an amplitude imbalance.

4. The computing system of claim 1, wherein the instructions, when executed by the computing device processor, further enables the computing system to:
   obtain a subsequent quadrature signal, the subsequent quadrature signal associated with a subsequent quadrature signal imbalance; and
   apply the first imbalance parameter estimate and the second imbalance parameter estimate to the subsequent quadrature signal to reduce one of a number of artifacts or errors of the subsequent quadrature signal by at least a threshold amount.

5. The computing system of claim 1, wherein the instructions, when executed by the computing device processor to determine the plurality of symmetry values, further enables the computing system to:
   determine a summation over frequency of products of pairs of power spectral densities of the set of complex-valued spectra at frequencies approximately mirrored about a center frequency, said power spectral densities being real numbers comprising magnitudes of samples of said complex-valued spectra at said frequencies.

6. The computing system of claim 1, wherein the instructions, when executed by the computing device processor to determine the symmetry value, further enables the computing system to:
   determine a value of the first imbalance parameter that satisfies a threshold value; and
   use a triangulation technique and the value of the first imbalance parameter to determine the symmetry value, wherein the symmetry value satisfies the selection criterion.

7. A method, comprising:
obtaining a quadrature signal;
determining a plurality of samples of the quadrature signal, a first sample of the plurality of samples associated with first in-phase data and first quadrature phase data, a second sample of the plurality of samples associated with second in-phase data and second quadrature phase data;
combining at least the first and second samples to generate a complex representation of the quadrature signal, the complex representation associated with a quadrature signal imbalance that includes a first imbalance parameter and a second imbalance parameter;
generating a set of corrected complex representations of the quadrature signal based at least in part on respective first imbalance parameter values and respective second imbalance parameter values;
generating a set of complex-valued spectra based at least in part on the set of corrected complex representations of the quadrature signal;
determining a plurality of symmetry values from the set of complex-valued spectra; and
identifying a symmetry value of the plurality of symmetry values, or determining a symmetry value based at least in part on the plurality of symmetry values, that satisfies a selection criterion, the symmetry value corresponding to a first imbalance parameter estimate and a second imbalance parameter estimate.

8. The method of claim 7, wherein the first imbalance parameter is an amplitude imbalance and the second imbalance parameter is a phase imbalance, or the first imbalance parameter is a phase imbalance and the second imbalance parameter is an amplitude imbalance.

9. The method of claim 8, further comprising:
determining said first imbalance parameter estimate by determining a nominal value of said first imbalance parameter for a system that generates said quadrature signal; and
equating said first imbalance parameter estimate to said nominal value.

10. The method of claim 8, further comprising:
determining a first value for a root-mean-square of the in-phase data;
determining a second value for the root-mean-square of the quadrature phase data;
determining a ratio of the first value and the second value; and
determining a difference between unity and said ratio, the difference corresponding to the first imbalance parameter estimate.

11. The method of claim 7, further comprising:
determining a value of the first imbalance parameter that satisfies a threshold value; and
using a triangulation technique and the value of the first imbalance parameter to determine the symmetry value, wherein the symmetry value satisfies the selection criterion.

12. The method of claim 11, further comprising:
proceeding, starting with an initial said plurality of samples, to identify said symmetry value that satisfies the selection criterion in an iterative manner, with a subsequent plurality of samples and an initial second imbalance parameter estimate corresponding to an initial said symmetry value serving as initial values for a second iteration; and
selecting, for a second iteration, a range for said respective second imbalance parameter values that is centered on the initial second imbalance parameter estimate;
identifying a subsequent symmetry value that satisfies the selection criterion, and a corresponding subsequent second imbalance parameter estimate;
combining the initial second imbalance parameter estimate and the subsequent second imbalance parameter estimate to determine a second imbalance parameter combined estimate.

13. The method of claim 7, further comprising determining in a repetitive manner a first imbalance parameter combined estimate and a second imbalance parameter combined estimate, by:
determining an initial said plurality of samples and using it to identify an initial symmetry value that satisfies the selection criterion;
determining a subsequent plurality of samples and using it to identify a subsequent symmetry value that satisfies the selection criterion;
combining estimates of the first imbalance parameter corresponding to the initial symmetry value and the subsequent symmetry value to determine the first imbalance parameter combined estimate;
combining estimates of the second imbalance parameter corresponding to the initial symmetry value and the subsequent symmetry value to determine the second imbalance parameter combined estimate.

14. A non-transitory computer readable storage medium storing instructions that, when executed by at least one processor of a computing system, causes the computing system to:
obtain a quadrature signal;
determine a plurality of samples of the quadrature signal, a first sample of the plurality of samples associated with first in-phase data and first quadrature phase data, a second sample of the plurality of samples associated with second in-phase data and second quadrature phase data;
combine at least the first and second samples to generate a complex representation of the quadrature signal, the complex representation associated with a quadrature signal imbalance that includes a first imbalance parameter and a second imbalance parameter;
generate a set of corrected complex representations of the quadrature signal based at least in part on respective first imbalance parameter values and respective second imbalance parameter values;
generate a set of complex-valued spectra based at least in part on the set of corrected complex representations of the quadrature signal;
determine a plurality of symmetry values from the set of complex-valued spectra; and
identify a symmetry value of the plurality of symmetry values, or determine a symmetry value based at least in part on the plurality of symmetry values, that satisfies a selection criterion, the symmetry value corresponding to a first imbalance parameter estimate and a second imbalance parameter estimate.

15. The non-transitory computer readable storage medium of claim 14, wherein the first imbalance parameter is an amplitude imbalance and the second imbalance parameter is a phase imbalance, or the first imbalance parameter is a phase imbalance and the second imbalance parameter is an amplitude imbalance.

16. The non-transitory computer readable storage medium of claim 15, wherein the instructions, when executed by the at least one processor, further enables the computing system to:
- determine a nominal value of said first imbalance parameter for a system that generates said quadrature signal; and
- equate said first imbalance parameter estimate to said nominal value.

17. The non-transitory computer readable storage medium of claim 15, wherein the instructions, when executed by the at least one processor, further enables the computing system to:
- determine a first value for a root-mean-square of the in-phase data;
- determine a second value for the root-mean-square of the quadrature phase data;
- determine a ratio of the first value and the second value; and
- determine a difference between unity and said ratio, the difference corresponding to the first imbalance parameter estimate.

18. The non-transitory computer readable storage medium of claim 14, wherein the instructions, when executed by the at least one processor, further enables the computing system to:
- determine a value of the first imbalance parameter that satisfies a threshold value; and
- use a triangulation technique and the value of the first imbalance parameter to determine the symmetry value, wherein the symmetry value satisfies the selection criterion.

19. The non-transitory computer readable storage medium of claim 18, wherein the instructions, when executed by the at least one processor, further enables the computing system to:
- proceed, starting with an initial said plurality of samples, to identify said symmetry value that satisfies the selection criterion in an iterative manner, with a subsequent plurality of samples and an initial second imbalance parameter estimate corresponding to an initial said symmetry value serving as initial values for a second iteration; and
- select, for a second iteration, a range for said respective second imbalance parameter values that is centered on the initial second imbalance parameter estimate;
- identify a subsequent symmetry value that satisfies the selection criterion, and a corresponding subsequent second imbalance parameter estimate;
- combine the initial second imbalance parameter estimate and the subsequent second imbalance parameter estimate to determine a second imbalance parameter combined estimate.

20. The non-transitory computer readable storage medium of claim 14, wherein the instructions, when executed by the at least one processor, further enables the computing system to:
- determine an initial said plurality of samples and use it to identify an initial symmetry value that satisfies the selection criterion;
- determine a subsequent plurality of samples and use it to identify a subsequent symmetry value that satisfies the selection criterion;
- combine estimates of the first imbalance parameter corresponding to the initial symmetry value and the subsequent symmetry value to determine a first imbalance parameter combined estimate;
- combine estimates of the second imbalance parameter corresponding to the initial symmetry value and the subsequent symmetry value to determine a second imbalance parameter combined estimate.

* * * * *